(12) United States Patent
Tanaka et al.

(10) Patent No.: US 8,203,261 B2
(45) Date of Patent: Jun. 19, 2012

(54) DISPLAY DEVICE

(75) Inventors: Masahiro Tanaka, Chiba (JP); Hitoshi Azuma, Yokohama (JP); Shoichi Uchino, Annaka (JP); Tomio Yaguchi, Sagamihara (JP); Akiko Iwata, Chiba (JP)

(73) Assignees: Hitachi Displays, Ltd., Chiba (JP); Panasonic Liquid Crystal Display Co., Ltd., Hyogo-ken (JP)

( * ) Notice: Subject to any disclaimer, the term of this patent is extended or adjusted under 35 U.S.C. 154(b) by 954 days.

(21) Appl. No.: 12/195,455

(22) Filed: Aug. 21, 2008

(65) Prior Publication Data

US 2009/0051640 A1 Feb. 26, 2009

(30) Foreign Application Priority Data

Aug. 21, 2007 (JP) ................. 2007-215031

(51) Int. Cl.
*H05B 33/00* (2006.01)
*G02F 1/1343* (2006.01)
(52) U.S. Cl. .......... 313/504; 313/505; 349/143
(58) Field of Classification Search .......... None
See application file for complete search history.

(56) References Cited

U.S. PATENT DOCUMENTS

| 6,936,846 B2 * | 8/2005 | Koyama et al. .......... 257/71 |
| 7,095,471 B2 * | 8/2006 | Wu .......... 349/141 |
| 2005/0117104 A1 * | 6/2005 | Nishida et al. .......... 349/141 |
| 2008/0303408 A1 * | 12/2008 | Yamazaki et al. .......... 313/498 |
| 2010/0019656 A1 * | 1/2010 | Yu et al. .......... 313/504 |

FOREIGN PATENT DOCUMENTS

JP 2005-099410 4/2005

* cited by examiner

*Primary Examiner* — Ashok Patel
(74) *Attorney, Agent, or Firm* — Antonelli, Terry, Stout & Kraus, LLP.

(57) ABSTRACT

A flexible display device bendable in a certain direction is realized. R, G, and B pixels are arranged in a mosaic pattern. The display is bendable in a first direction, but is not assumed to be bent in a second direction. A data line extends in the first direction and a select line extends in the second direction. In order to prevent accumulation of distortion in the data line and breakage of the data line when the display is bent in the first direction, the data line is formed into a crank shape. Accordingly, even when the display is bent, an amount of distortion accumulated in the data line corresponds to only a length thereof in the first direction, and therefore, the distortion can be reduced. As a result, breakage of a wire in a flexible display can be prevented.

6 Claims, 9 Drawing Sheets

DISPLAY DEVICE

CROSS-REFERENCE TO RELATED APPLICATION

The present application claims priority from Japanese application JP 2007-215031 filed on Aug. 21, 2007, the content of which is hereby incorporated by reference into this application.

BACKGROUND OF THE INVENTION

1. Field of the Invention

The present invention relates to a thin-type display, and more particularly, to a flexible display bendable in one direction.

2. Description of the Related Art

Liquid crystal display devices, organic EL display devices and the like have increasingly been demanded as flat displays for monitors, TV sets and the like because of their flat screens. And, the demands for the liquid crystal display devices, the organic EL display devices and the like may be increased in various fields because they are thin and light in addition to having flat screens. In other words, installations of the displays to various locations are under planning by taking advantages that the display devices are thin.

The demands are, for example, that the displays are attached to columns in stations or the displays are attached to curved portions between a wall and a ceiling of a train. In order to attach the displays to such locations, the displays must be flexible (bendable). However, in the conventional liquid crystal display devices or the conventional organic EL display devices, wires, thin film transistors (TFTs), pixels and the like are formed over a glass substrate having a certain thickness, and therefore, it is difficult to bend displays thereof.

In order to make the substrate flexible, for example, a plastic substrate may be used. However, with current technologies, it is difficult to directly form the TFTs and the like over the plastic substrate. A technology of forming the TFTs over the glass substrate and transferring the TFTs formed over the glass substrate to the plastic substrate is disclosed in Japanese Patent Application Laid-Open Publication JP2005-099410 (Patent Document 1). In Patent Document 1, it is described that, in order to transfer the TFTs onto the plastic substrate, the TFTs, connection wires and the like are formed into special shapes.

According to the technology described in Patent Document 1, since the TFTs are formed over the glass substrate and then transferred to the plastic substrate, the TFTs can be arranged over the plastic substrate. However, Patent Document 1 does not have description about a problem of distortion applied to respective components of the flexible display when the flexible display is bent, after the flexible display is manufactured.

That is, when the display is bent, distortion is applied to data lines, scanning lines and the like, which are components of the substrate of the display. And when the distortion becomes large, the data lines, scanning lines and the like are broken. It is a problem that the display becomes defective by bending, even if the bendable display is manufactured.

Of flexible displays, displays flexible in all directions are not so high in demand. At present, displays required to be flexible in only one direction and not required to be flexible in the other directions, such as displays set to columns in stations, are high in demand. An object of the present invention is to realize a flexible display in which breakage of a wire or the like does not occur even if the display is bent in one direction.

SUMMARY OF THE INVENTION

The present invention is made to solve the problem described above. That is, the TFTs, the data lines, scanning lines and the like are formed over a bendable thin glass substrate. And, this glass substrate is bonded to a high-elastic modulus substrate via a bonding material reducing a tensile stress or a compressive stress. On the other hand, the data lines or signal lines are formed into not a linear shape but a crank shape or an S-shape in a bending direction in order to prevent accumulation of distortion. Associated means are as follows.

(1) A display device bendable in at least one direction and comprising: data lines extending in a first direction and arranged in a second direction; scanning lines extending in the second direction and arranged in the first direction; and a TFT substrate having a TFT and a pixel electrode formed in a region surrounded by the data lines and the scanning lines, wherein the TFT substrate is bonded to a base material film via a bonding layer.

(2) The display device according to item (1), wherein the base material film is formed of one of polyimide, polyamide-imide, polyesterimide, polyetherimide, polyester and polycarbonate.

(3) The display device according to item (1), wherein the base material film has physical properties including a size change rate equal to or smaller than 0.04%, an internal stress equal to or smaller than 40 MPa and an elastic modulus of 1 GPa to 10 GPa.

(4) The display device according to item (1), wherein the bonding layer is composed of one of a rubber bonding material and a rubber adhesive material.

(5) The display device according to item (1), wherein the bonding layer is composed of a composite material system including an epoxy curing component and a rubber elastomer.

(6) The display device according to item (1), wherein the bonding layer is a combination of a heat curable resin such as an epoxy resin system, a polyimide resin system and a phenol resin system; and a polymer such as an acrylic rubber, NBR, epoxy butadiene and a phenoxy resin.

(7) The display device according to item (1), wherein the bonding layer has an elastic modulus of 1 MPa to 500 MPa and a storage elastic modulus of 10 MPa to 50 MPa.

(8) An organic EL display device bendable in a first direction and comprising: data lines extending in a first direction and arranged in a second direction; select lines extending in the second direction and arranged in the first direction; and a TFT substrate having a TFT and an organic EL layer formed in a region surrounded by the data lines and the select lines, wherein the data lines include a portion in the first direction and a portion in a direction different from the first direction connected with each other at a predetermined pitch.

(9) The organic EL display device according to item (8), wherein the direction different from the first direction is the second direction.

(10) The organic EL display device according to item (8), wherein the direction different from the first direction is an intermediate direction between the first direction and the second direction.

(11) The organic EL display device according to item (8), wherein the portion in the first direction of the data lines has a length equal to or smaller than 0.5 mm.

(12) An organic EL display device bendable in a second direction and comprising: data lines extending in a first direction and arranged in the second direction; select lines extending in the second direction and arranged in the first direction; and a TFT substrate having a TFT and an organic EL layer formed in a region surrounded by the data lines and the select lines, wherein the select lines include a portion in the second direction and a portion in a direction different from the second direction connected with each other at a predetermined pitch.

(13) The organic EL display device according to item (12), wherein the portion in the second direction of the select lines has a length equal to or smaller than 0.5 mm.

(14) A liquid crystal display device bendable in a first direction and comprising: data lines extending in the first direction and arranged in a second direction; scanning lines extending in the second direction and arranged in the first direction; and a TFT substrate having a TFT and a pixel electrode formed in a region surrounded by the data lines and the scanning lines, wherein the data lines include a portion in the first direction and a portion in a direction different from the first direction connected with each other at a predetermined pitch.

(15) The liquid crystal display device according to item (14), wherein the direction different from the first direction is the second direction.

(16) The liquid crystal display device according to item (14), wherein the direction different from the first direction is an intermediate direction between the first direction and the second direction.

(17) The liquid crystal display device according to item (14), wherein the portion in the first direction of the data lines has a length equal to or smaller than 0.5 mm.

(18) A liquid crystal display device bendable in a second direction, comprising: data lines extending in a first direction and arranged in the second direction; scanning lines extending in the second direction and arranged in the first direction; and a TFT substrate having a TFT and a pixel electrode formed in a region surrounded by the data lines and the scanning lines, wherein the scanning lines include a portion in the second direction and a portion in a direction different from the second direction connected with each other at a predetermined pitch.

(19) The liquid crystal display device according to item (18), wherein the portion in the second direction of the scanning lines has a length equal to or smaller than 0.5 mm.

(20) An organic EL display device bendable in a first direction, comprising: data lines and power lines extending in the first direction and arranged in a second direction; select lines extending in the second direction and arranged in the first direction; and a TFT substrate having a TFT and an organic EL layer formed in a region surrounded by the data lines and the select lines, wherein a plurality of wires of the power lines become a power line group having a large width in a vicinity of a terminal of the TFT substrate and wherein the power lines have a plurality of openings formed therein.

(21) A liquid crystal display device bendable in a first direction, comprising: data lines extending in the first direction and arranged in a second direction; scanning lines extending in the second direction and arranged in the first direction; and a TFT substrate having a TFT and a pixel electrode formed in a region surrounded by the data lines and the scanning lines, a common electrode opposed to the pixel electrode and a wire connected with the common electrode, wherein the wire connected with the common electrode has a plurality of openings formed therein.

According to the present invention, since a TFT, a wire, a pixel and the like are formed over a thin glass substrate and the thin glass substrate is bonded to a substrate having high-elastic modulus via a bonding material reducing a tensile stress or a compressive stress, a stress to the glass substrate and a stress to the TFTs, the wire, the pixel and the like formed over the glass substrate can be reduced.

And, in the direction of bending the display, the wire is formed into not a linear shape but a crank shape or an S-shape, and therefore, distortion to the wire is not accumulated. By suppressing a straight line length of the wire in the direction of bending to a value equal to or smaller than a certain value, the distortion accumulated in the wire can be suppressed to a level equal to or smaller than a limit at which the wire is broken.

According to the present invention, a display flexible in one direction and having high reliability can be realized.

DETAILED DESCRIPTION OF THE INVENTION

The detailed content of the present invention will be disclosed based on embodiments.

First Embodiment

Figure 1:
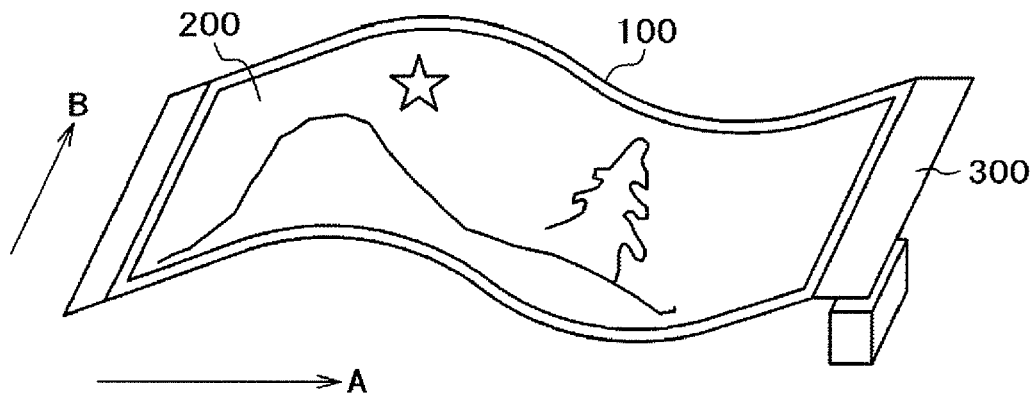
FIG. 1 is an external view showing a display device according to the present invention.

FIG. 1 is an external view showing a display device according to the present invention. In FIG. 1, a display 100 can be bent freely in an A-direction. On the other hand, the display 100 cannot be bent in a B-direction. Therefore, a fixing flame 300 is provided to a short side of the display 100 in FIG. 1. In a case where the display 100 is set to a column in a station or the like, the display 100 in the A-direction is wound around the column in the A-direction.

Figure 2:
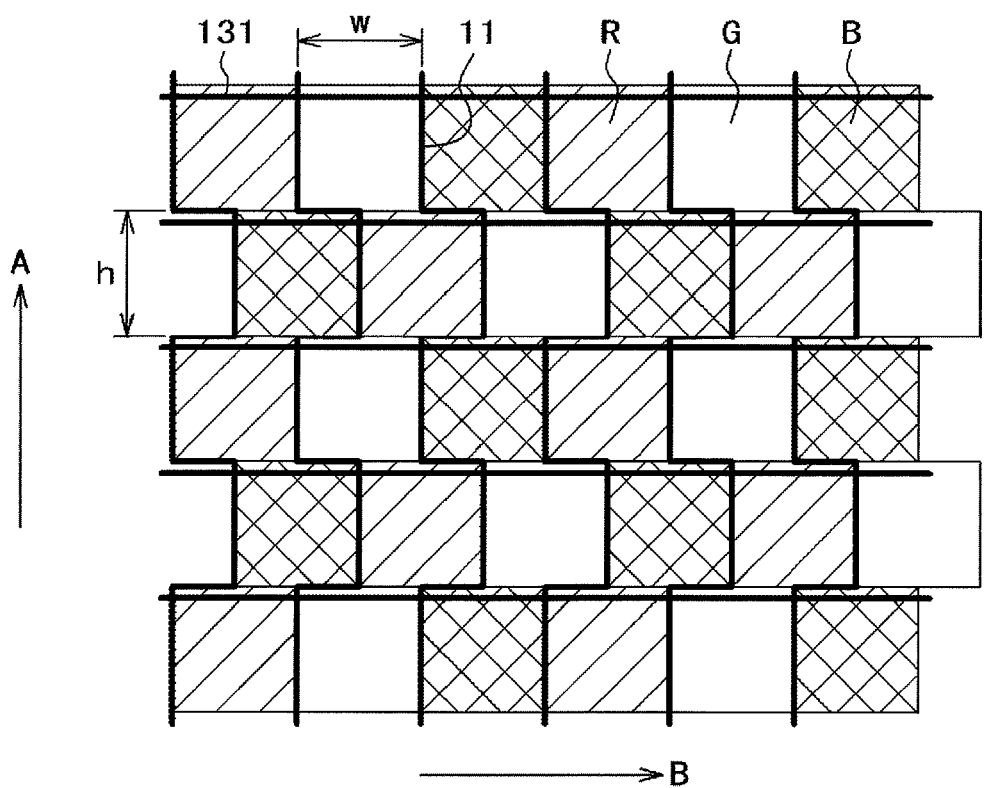
FIG. 2 is a diagram showing an example of a pixel arrangement according to the present invention.

FIG. 2 is a diagram showing examples of a pixel arrangement and a wire of the display in FIG. 1. An A-direction and a B-direction of FIG. 2 coincide with the A-direction and the B-direction in FIG. 1, respectively. That is, the display can be bent in the A-direction in FIG. 2, but it is not assumed that the display is bent in the B-direction in FIG. 2. In FIG. 2, an R indicates a red pixel, a G indicates a green pixel and a B indicates a blue pixel. In FIG. 2, the R, G and B are arranged in a mosaic pattern. Note that, the arrangement of the pixels in the present invention is not limited to the mosaic pattern.

In FIG. 2, data lines 11 extend in the A-direction. The data lines 11 are bent into a crank shape according to the arrangement of the pixels. Since the data lines 11 are bent into such a shape, a straight line distance in the A-direction is a length h of each of the pixels. Note that, width of each of the pixels is w. In this embodiment, since the pixels are arranged in the mosaic pattern, the length h and the width w of each of the pixels are equal. When the display is bent in the A-direction, distortion is caused in the data lines 11 and the distortion is accumulated proportionally to the straight line distance in the A-direction. In FIG. 2, the distortion accumulated in the data lines 11 is only an amount corresponding to the length h. Therefore, the distortion can be reduced and the data lines 11 can be prevented from breakage when the display is bent.

In FIG. 2, scanning lines 131 (select lines or reset lines in a case of an organic EL display device) are arranged in a straight-line shape in the B-direction. Because it is not assumed that the display is bent in the B-direction, distortion is not caused in the scanning lines 131. Therefore, since no distortion is accumulated, the scanning lines 131 are not bent into the crank shape and arranged in the straight-line shape.

The display according to the present invention may be a liquid crystal display device or an organic EL display device. The liquid crystal display device requires two substrates, that is, a TFT substrate and a color filter substrate, in order to form an image. On the other hand, in the organic EL display device, a wire, a TFT, an organic EL element and the like can be provided only to the TFT substrate. Hereinafter, an example of the organic EL display device will be described. Note that, the same can be applied to the liquid crystal display device.

Figure 3:
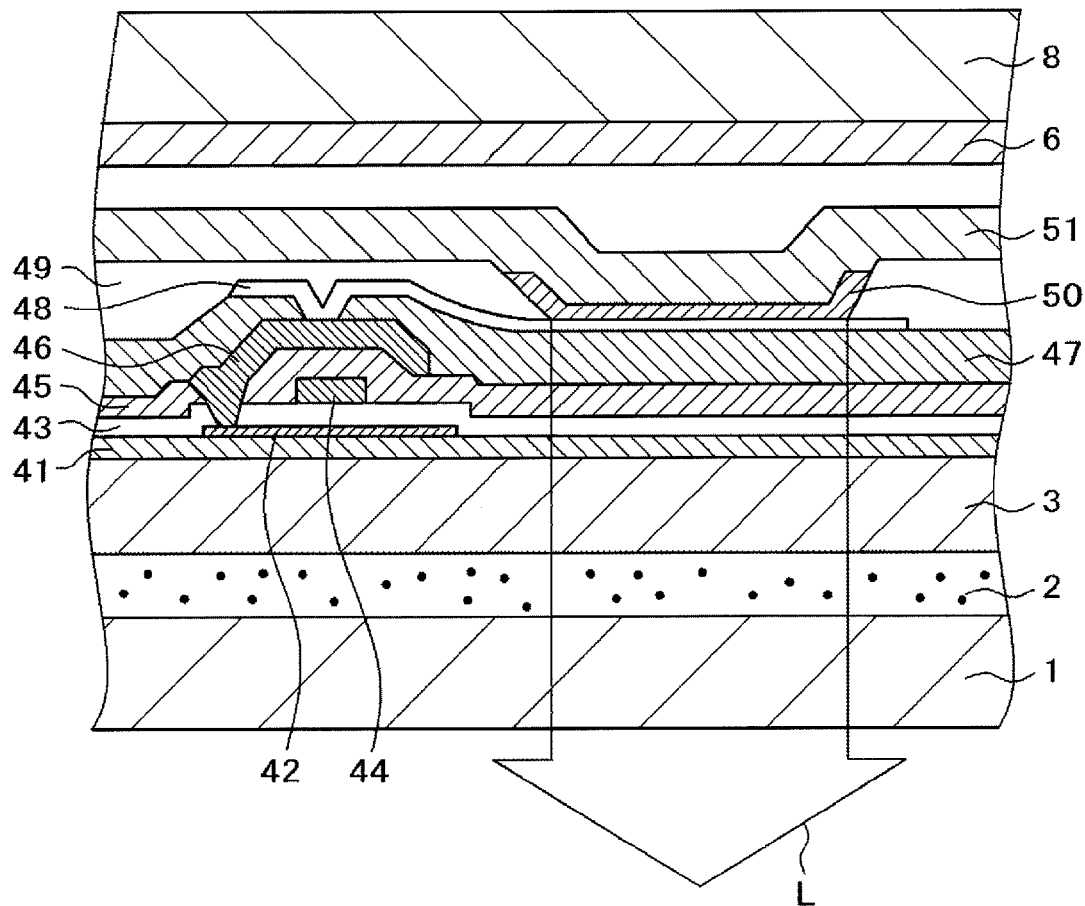
FIG. 3 is a cross sectional view showing an organic EL display device according to the present invention.

FIG. 3 is a cross sectional view of an organic EL display device according to the present embodiment. FIG. 3 shows a so-called bottom emission organic EL display device in which light generated in an organic EL layer 50 goes in a direction indicated by an arrow of FIG. 3, that is, toward a side of a TFT substrate 3 or a film base material 1. In the organic EL display device according to the present embodiment, a TFT, a data line 11, a power line 12, a select line 13, a reset line 14, the organic EL layer 50 and the like are formed over a thin TFT substrate 3. The thin TFT substrate 3 is bonded to the film base material 1 using a bonding material. Here, a thickness of the TFT substrate 3 is approximately 50 μm. After the TFT and the like are formed, the TFT substrate 3 is thinned to approximately 50 μm by mechanical polishing and chemical polishing. If the thickness of the TFT substrate 3 is approximately 50 μm, the TFT substrate 3 can be easily bent to a curvature radius of approximately 30 mm.

The organic EL layer 50, the TFT driving the organic EL layer 50 and the like are formed over the TFT substrate 3. In FIG. 3, first, a base film 41 is formed over the TFT substrate 3 so as to coat the same. The base film 41 may have two-layer structure of SiN and $SiO_2$. This base film is provided for preventing a semiconductor layer 42 from being contaminated by impurities from the glass. A semiconductor layer 42 forming the TFT is formed over the base film 41 at a thickness of approximately 50 nm.

A gate insulating film 43 is formed so as to cover the semiconductor layer 42. The gate insulating film 43 is normally made of $SiO_2$ from tetraethoxysilane (TEOS). A gate electrode 44 is formed over the semiconductor layer 42 and the gate insulating film 43. The gate electrode 44 is formed in the same layer as the select line 13 and the like. That is, the gate electrode 44 is formed simultaneously with formation of the select line 13 and the like. The gate electrode 44 is mainly made of Al, and upper and lower surfaces thereof are covered with Mo. Al is a soft metal and Mo is a hard metal. Layered structure of a soft metal and a hard metal as described above is strong against a bending stress.

That is, a soft material easily absorbs a stress, but a part thereof is likely to be significantly deformed. If the deformation is too large, the soft material cannot return to an original shape. Therefore, it is necessary to uniformly disperse the deformation to the entire soft material. If a hard material and the soft material are layered, the deformation is dispersed to the entire layered structure, and therefore, the deformation at a specific location such as folding can be prevented. Note that, by sandwiching the Al by the Mo, effects that a hillock of the Al is prevented from occurring and that poor contact between the Al and ITO due to oxidation of the AL when the AL is in contact with the ITO is prevented from occurring are obtained.

An interlayer insulating film 45 made of SiN is formed to cover the gate electrode 44. The interlayer insulating film 45 is for insulating the select line 13 and the like from the data line 11. A drain electrode 46 is formed over the interlayer insulating film 45. The drain electrode 46 is connected with a drain region of the semiconductor layer 42 through a through hole formed in the interlayer insulating film 45 and the gate insulating film 43.

The drain electrode 46 is formed in the same layer as the data line 11. That is, the drain electrode 46 is formed by the same process as that of the data line 11. The drain electrode 46 is mainly made of Al and upper and lower surfaces thereof are covered with Mo. As described above, the layered structure of the soft metal and the hard metal as described above is strong against the bending stress. An amount of a current flowing through the data line 11 is larger than that of a current flowing through the select line 13 and the like, and therefore, the data line 11 is made larger in film thickness than the select line 13 and the like. If the film thickness is large, distortion caused by bending is large, and therefore, the layered structure has a larger effect than that in a case of the select line 13 and the like.

A passivation film 47 for protecting the TFT is formed to cover the drain electrode 46. The passivation film 47 may have two-layer structure of an inorganic passivation film and an organic passivation film. The inorganic passivation film is made of SiN, and the organic passivation film is made of a polyimide resin or an acrylic resin. The organic passivation film is formed at a thickness of 1 μm to 2 μm and also has a function of surface leveling.

A lower electrode 48 for supplying a signal to the organic EL layer 50 is formed over the passivation film 47. The lower electrode 48 is made of ITO which is a transparent conductive film. A bank 49 for separating pixels is formed over the lower electrode 48 and the passivation film 47. The bank 49 is made of a resin such as polyimide or acrylic. The bank 49 may be made of an inorganic material such as SiN. An organic EL layer 50 is formed over the lower electrode 48 between the adjacent banks 49. That is, the organic EL layer 50 is formed so as to cover a region of the lower electrode 48 where the bank 49 is not formed.

The organic EL layer 50 is formed for each pixel by mask evaporation and the like. The organic EL layer 50 is composed of a plurality of layers. An upper electrode 51 for supplying a current to the organic EL layer 50 is formed over the organic EL layer 50. The upper electrode 51 is made of Al, Al alloy or the like. The upper electrode 51 is required to have small electrical resistance and to be made of a high-reflectance metal. This is because light emitted from the organic EL layer 50 has to be reflected in the direction indicated by an arrow L in FIG. 3.

Figure 4:
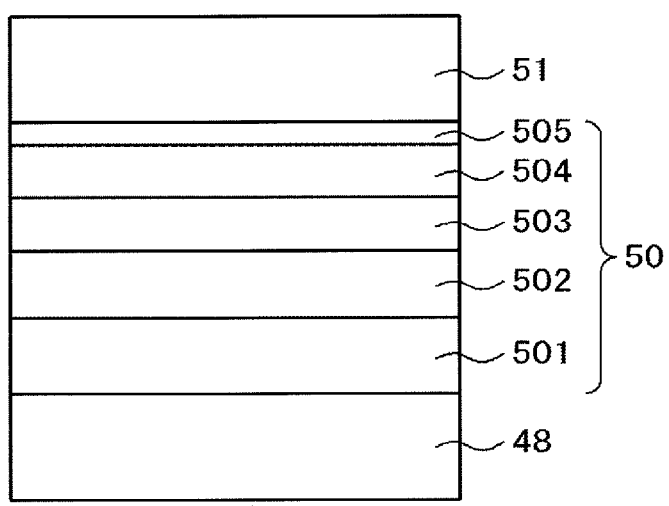
FIG. 4 is a schematic cross sectional view showing an organic EL layer according to the present invention.

FIG. 4 is a schematic cross sectional view showing the organic EL layer 50. The organic EL layer 50 in the present embodiment has five-layer structure. In FIG. 4, over the lower electrode 48 which is a transparent electrode, a hole injecting layer 501 having a thickness of 50 nm, a hole transporting layer 502 having a thickness of 40 nm, a light emitting layer 503 having a thickness of 20 nm, an electron transporting layer 504 having a thickness of 20 nm and an electron injecting layer 505 having a thickness of 0.5 nm are formed. These layers are formed by mask evaporation and made of an organic material such as tris(8-quinolinol) aluminum.

A characteristic of the organic EL layer 50 is degraded by moisture. That is, a light emitting characteristic is degraded if moisture exists, and therefore, it is necessary to prevent moisture from entering the organic EL layer 50. Therefore, an entire side of the display device having the organic EL layer 50 formed is covered with a sealing film 8. An organic material can be used for the sealing film 8. Since the organic material transmits moisture, a barrier layer 6 is formed over an inner surface of the sealing film 8 in this embodiment. The barrier layer 6 is formed by bonding an Al foil having a thickness of 12 μm to the inner surface of the sealing film 8.

As the barrier layer 6, a glass foil having a thickness of 20 μm to 50 μm may be bonded to the sealing film 8 instead of the Al foil. Alternatively, a film obtained by coevaporating $SiO_2$ and $Al_2O_3$ to the sealing film 8 or a film obtained by forming an $SiO_2$ film or an SiN film on the sealing film 8 by the CVD method can be used.

The entire sealing film 8 is bonded to the TFT substrate 3 by a bonding material in the vicinity of the display device, and therefore, the entire organic EL display device is sealed to be protected from moisture. In FIG. 3, a gap of approximately 0.1 mm to 0.2 mm exists between the upper electrode 51 of the organic EL layer 50 and the barrier layer 6 of the sealing layer 8.

The TFT substrate 3 having the TFT, the organic EL layer 50 and the like formed as described above is bonded to the film base material 1 via the bonding layer 2. A thickness of the film base material 1 is approximately 100 μm. Strength of the organic EL display device according to the present embodiment is determined mainly based on the film base material 1. Since the TFT is made of a relatively hard inorganic material, the TFT is sensitive to a change in size, and therefore, the TFT is torn by tension and buckled by compression. Therefore, the film base material 1 is required to be hard and to exhibit less change in size. That is, a material having a high elastic modulus and less expand and contract regardless of any external force is used as the film base material 1.

The physical properties of the film base material 1 are required to be as follows. A size change rate is low, more specifically, a value equal to or smaller than 0.04%. An internal stress is low, more specifically, a value equal to or smaller than 40 MPa. An elastic modulus is high, more specifically, a value of approximately 1 GPa to 10 GPa. As plastic films having the properties described above, there are polyimide, polyamideimide, polyesterimide, polyester, polycarbonate and the like. Here, it is assumed that the display is rolled up at a curvature radius R. If a film thickness is D, distortion of Dπ is generated for each turn, and distortion per unit length is D/2R. And therefore, the distortion becomes smaller as the film becomes thinner.

Even if the film base material 1 is thinned, a compressive stress or a tensile stress is generated in a surface of the film by bending. In order to reduce the stress, the bonding layer 2 desirably has a low elastic modulus, more specifically, a low storage elastic modulus, that is, a deformable characteristic. Here, the low elastic modulus means that no stress is applied at a time of bending, and the low storage elastic modulus means that the bonding layer 2 does not return to an original shape after bending. That is, when the display is bent, a stress applied to the TFT substrate 3, the TFT, the wire and the like becomes smaller by slide in the bonding layer 2.

The elastic modulus of the bonding material is preferably 1 MPa to 500 MPa and the storage elastic modulus thereof is preferably 10 MPa to 50 MPa. As bonding materials having the properties described above, there are a rubber bonding material, a rubber adhesive material and the like. A composite material system composed of an epoxy curing component and a rubber elastomer is preferable because an elastomer part slides and a stress is reduced.

Instead of a rubber, a low-molecular-weight epoxy resin (having molecular weight of 5000 or less) may be contained. As the similar mixture bonding materials, combination of a heat curable resin such as an epoxy resin system, a polyimide resin system or a phenol resin system; and a polymer such as an acrylic rubber, NBR, epoxy butadiene, or a phenoxy resin can be used effectively. Although a polyimide bonding material or a polyamide bonding material can be also used, in this case also, it is desirable that the bonding material is composed of a crosslinked component and a non-crosslinked elastomer component. And, a sheet obtained by impregnating a resin having bonding and fusion properties with a porous polymer has the same effect.

In the structure described above, since the film base material 1 is thin, distortion caused by bending can be reduced. And, distortion can be significantly absorbed by deformation of the bonding layer 2. In order to absorb the distortion, the bonding layer 2 is preferably thickened. However, if the bonding layer 2 becomes thicker, an amount of displacement due to bonding increases. An amount of distortion which can be absorbed by the bonding layer 2 is 2% to 5% of a thickness of the bonding layer 2. Therefore, a thickness of the film base material 1 corresponding thereto is 100 μm to 50 μm in view of film strength.

As described above, as the entire display device, by laminating the film base material 1 which is the hard material and the bonding layer 2 which is the soft material, a flexible display device resistant to bending can be realized. The layered structure of the display device which is countermeasure against stress and distortion caused by bending is described above. In the present invention, not only the layered structure described above but also a two-dimensionally arrangement of a wire and the like is used as countermeasure against the stress and distortion caused by bending.

When the flexible display is bent, distortion is generated not only in the structure but also in a wire formed over the TFT substrate 3. When the distortion of the wire becomes larger, the wire is broken. Considering the distortion generated in the wire formed over the TFT substrate 3, in a case of a long wire, the distortion accumulates, and the distortion cannot be absorbed. When the display is bent, an amount of distortion which can be absorbed by the bonding layer 2 is 2% to 5% of a thickness of the bonding layer 2.

For example, assume that the display is wound around a column having diameter of 30 mm. If the film base material 1 is 100 μm in thickness and the bonding layer 2 is 50 μm in thickness, a distortion rate is 0.5%. This means that an amount of distortion per turn is 470 μm. Note that a total thickness of the thickness of the film base material 1 (100 μm) and the thickness of the bonding layer 2 (50 μm) is 0.15 mm, and therefore, 0.15/30=0.5%. In addition, 0.5%×30 mm×π=0.47 mm. If such large distortion is applied to the wire, the wire is broken.

That is, considering the distortion caused in the wire formed over the TFT substrate 3, since the distortion accumulates in a case of long wire, the distortion cannot be absorbed. In order to prevent the wire from being broken, it is necessary to reduce the amount of distortion to a value equal to or smaller than 2.5 μm which is 5% of the thickness of the bonding layer 2 (50 μm). Therefore, a length of the wire is required to be equal to or smaller than 0.5 mm. This means that, in the wire pattern shown in FIG. 2, a longitudinal length h of the data line 11 is set to a value equal to or smaller than 0.5 mm.

Figure 5:
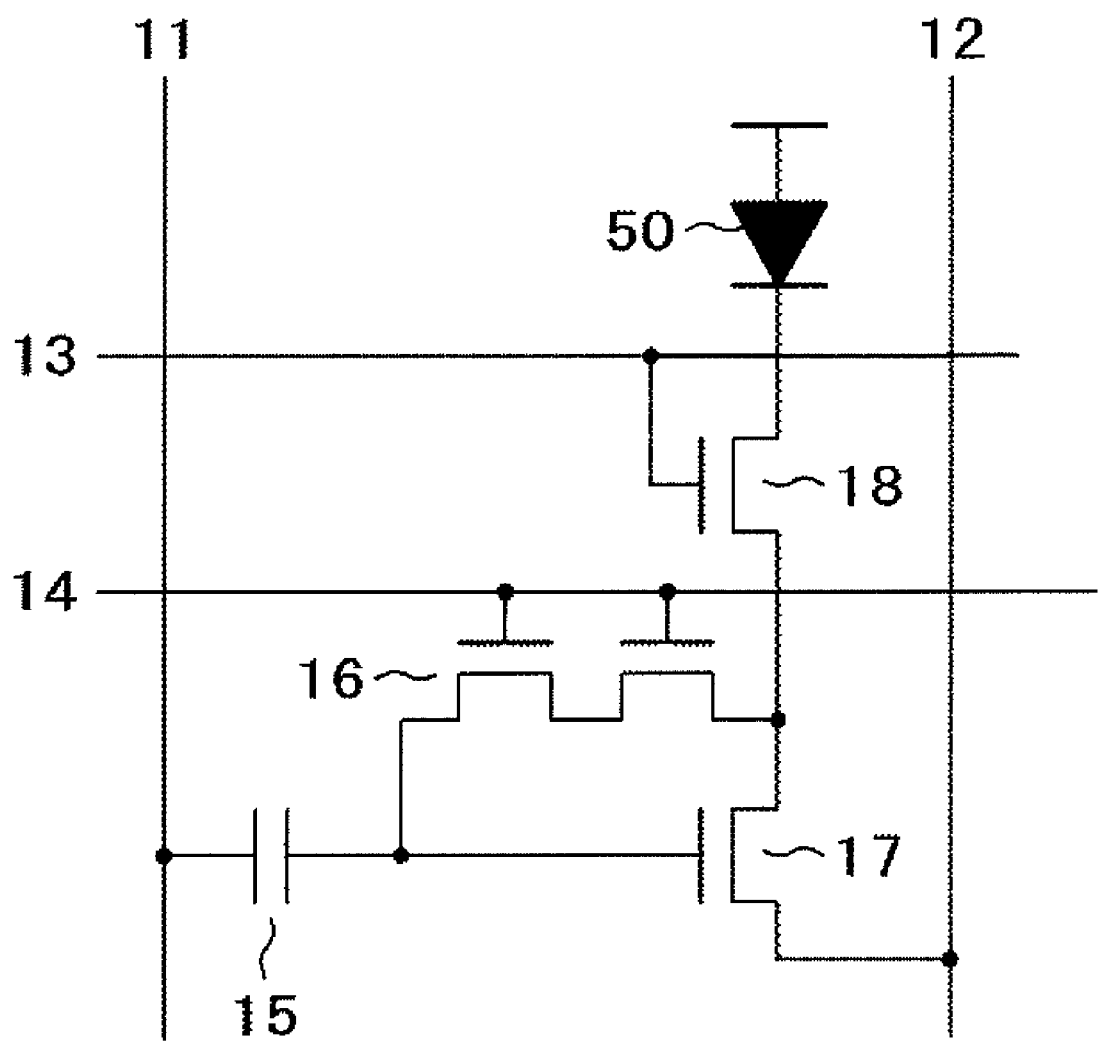
FIG. 5 is a diagram showing an equivalent circuit of a pixel portion of the organic EL display device according to the present invention.

A driver circuit for a pixel portion of the organic EL display device according to the present embodiment is shown in FIG. 5. In FIG. 5, when a reset line 14 of a specific pixel is selected, charges corresponding to a signal of the data line 11 are stored in a capacitor 15. During this period, a select line 13 is not selected, and a transistor 18 is in an OFF state. A reset transistor 16 is in an ON state, and a gate and a drain of a light emission adjusting transistor 17 are short-circuited. Therefore, charges reflecting a signal voltage are stored in the capacitor 15 regardless of a threshold voltage of the light emission adjusting transistor 17. After data signals are written into all pixels in this manner, the select line 13 is turned ON to emit light from the organic EL layer 50. A current flowing through the organic EL layer 50 is controlled by the light emission adjusting transistor 17. Thus, the light emission adjusting transistor 17 flows a current reflecting the charges stored in the capacitor 15 into the organic EL layer 50.

Figure 6:
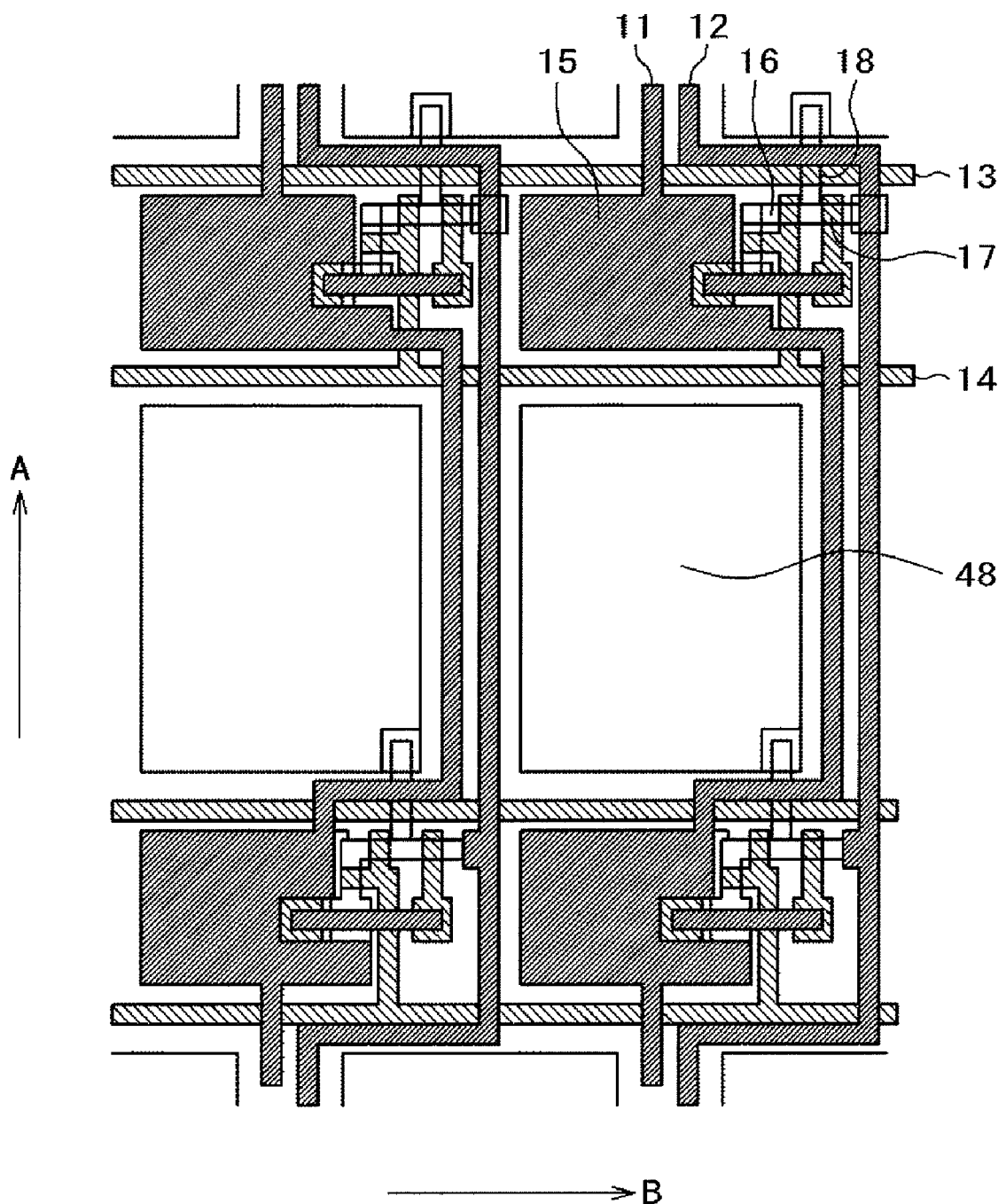
FIG. 6 is a diagram showing a layout of the pixel portion of the organic EL display device according to the present invention.

FIG. 6 shows a specific layout pattern of the driver circuit shown in FIG. 5. In FIG. 6, the data line 11 and the power line 12 extend longitudinally and the select line 13 and the reset line 14 extend laterally. A circuit for each pixel is composed of the capacitor 15 recording data, the reset transistor 16, the light emission adjusting transistor 17 and a light emission stopping transistor 18 stopping light emission during signal writing. In FIG. 6, a drain of the light emission stopping transistor 18 is connected with the lower electrode 48 of the organic EL layer 50. In the present embodiment, a pixel electrode of the organic EL display device means the lower electrode 48 of the organic EL layer 50.

Here, an important point is that the data line 11 is bent into a crank shape. Therefore, when the data line 11 is bent in the A-direction, an amount of distortion accumulated in the data line 11 corresponds to only a length of a portion parallel to the lower electrode 48, and therefore, the distortion can be reduced. The power line 12 is arranged substantially parallel to the data line 11. A current from the power line 12 flows into the lower electrode 48 through the light emission adjusting transistor 17 and the light emission stopping transistor 18. The power line 12 is also bent into a crank shape. Accordingly, distortion is accumulated in only a portion of the power line 12 parallel to the pixel electrode, and therefore, the power line 12 is not broken. Here, a length of a portion of the power line 12 parallel to the lower electrode 48 is approximately 0.141 mm, which is smaller than 0.5 mm corresponding to a line length determining a limit value of the distortion.

On the other hand, the select line 13 and the reset line 14 are not bent. In the present embodiment, it is not assumed that the display device is bent in the B-direction. Therefore, distortion is not accumulated even if the select line 13 and the reset line 14 are linearly arranged. Note that, the scanning line of the organic EL display device is strictly different from that of the liquid crystal display device. However, the select line 13 and the reset line 14 of the organic EL display device have a function selecting a pixel in a row direction, in the same manner as the scanning lines. In this sense, the select line 13 and the reset line 14 may be called the scanning line. For the sake of convenience, assume that the scanning line denotes the select line 13 in the organic EL display device.

Figure 7:
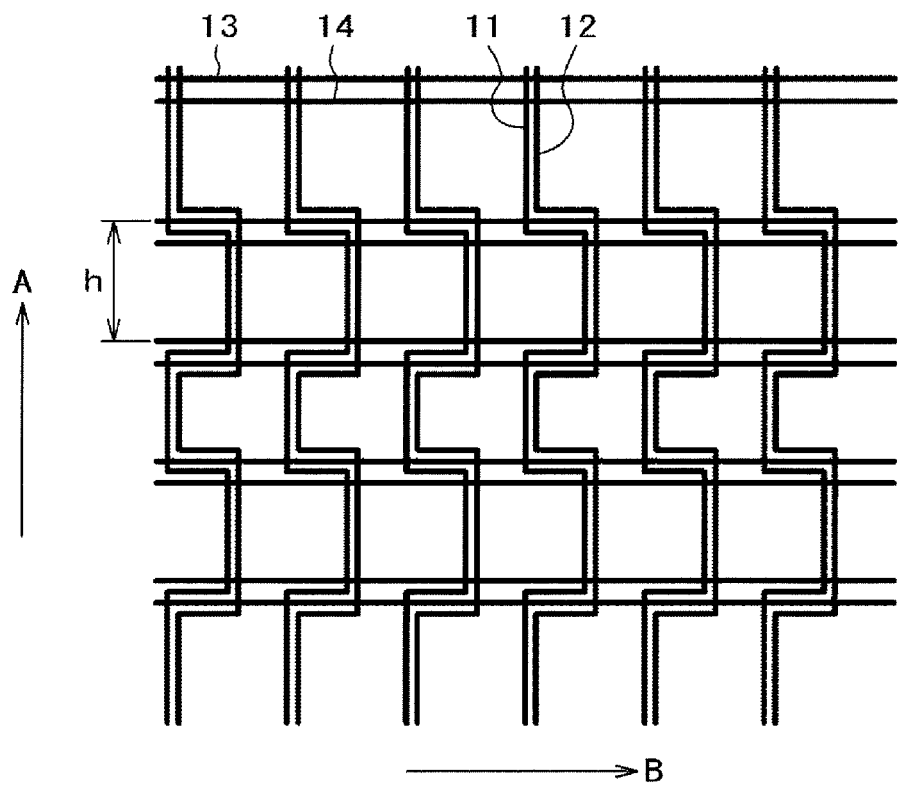
FIG. 7 is a schematic view showing a wire according to a first embodiment of the present invention.

FIG. 7 shows the data line 11, the power line 12, the select line 13 and the reset lines 14 extracted from FIG. 6. The data line 11 and the power line 12 are bent into a crank shape. It is assumed that the display is bent in the A-direction. The straight line distance of the data line 11 or the power line 12 in the A-direction is h. Since this value is approximately 0.141 mm, an amount of distortion accumulated in the length is small. An amount of distortion corresponding to 0.5% of 0.141 mm is 0.7 μm. This value is significantly smaller than 2.5 μm which is 5% of the thickness of the bonding layer 2 (50 μm).

In FIG. 7, the select line 13 and the reset line 14 are not bent and linearly arranged. This is because it is not assumed in the present embodiment that the display is bent in the B-direction of FIG. 7. Note that, in a case where the display is bent not in the A-direction of FIG. 7 but in the B-direction of FIG. 7, the select line 13 or the reset line 14 may be bent and the data line 11 or the power line 12 may be linearly arranged in FIG. 7.

Figure 8:
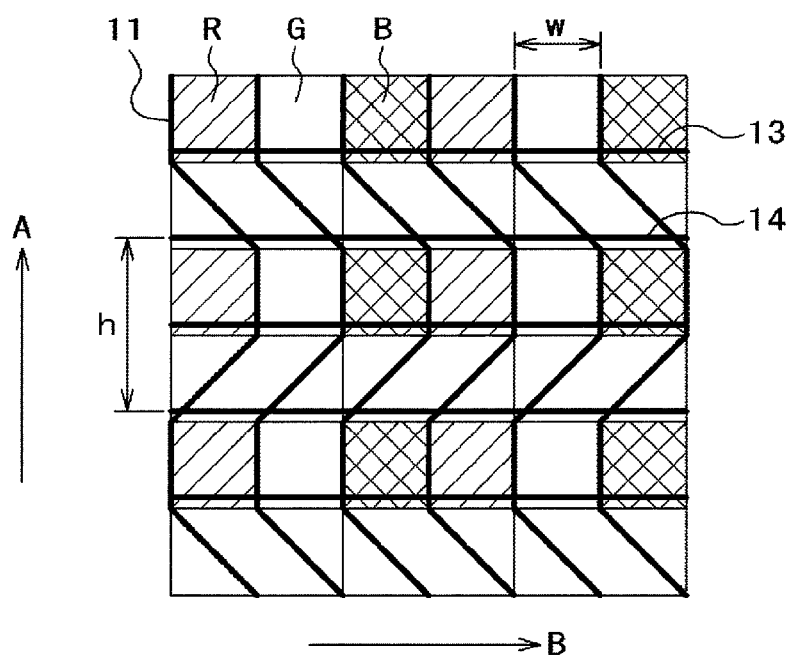
FIG. 8 is a pixel arrangement diagram showing a first modified example of the first embodiment of the present invention.
Figure 9:
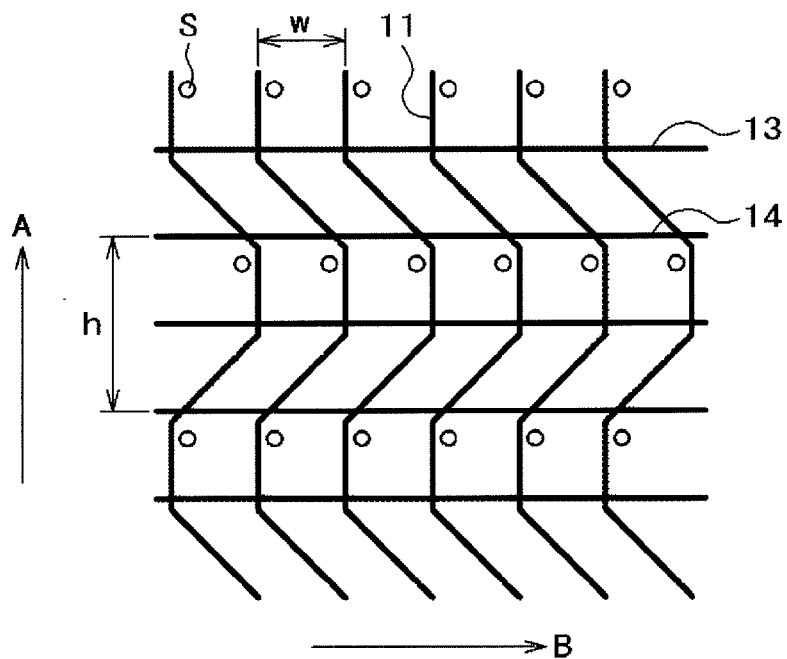
FIG. 9 is an arrangement diagram showing data lines and select lines of FIG. 8.

In the embodiment described above, the data line 11 or the power line 12 is bent into a crank shape to reduce the amount of distortion accumulated in the wire. The reduction in the amount of distortion accumulated in the wire is not limited to the case where the data line 11 and the like are bent into a crank shape. FIGS. 8 and 9 show a first modified example of the present embodiment. In FIG. 8, pixels R, G and B are arranged in the B-direction. Pixels having the same color are arranged in the A-direction.

In FIG. 9, the data line 11 is obliquely wired between adjacent pixels arranged in the A-direction. By wiring obliquely, accumulation of distortion in the data line 11 can be prevented when the display is bent in the A-direction. In a region between the adjacent pixels, a capacitor and various TFTs can be arranged.

In FIG. 8, the data line 11 extends in the A-direction for each pixel. Each pixel captures image data from the data line 11. As shown in FIG. 9, switching elements S including TFTs for capturing the image data are staggered as viewed in the longitudinal direction. This is because pixels having the same color are required to capture the image data from the same data line 11. Although the power lines 12 are omitted in FIG. 8, the power lines 12 are fundamentally arranged in the same manner as the data lines 11.

FIG. 9 shows only an arrangement of the data line 11, the select line 13 and the reset line 14 of FIG. 8. In FIG. 9, a pixel pitch h in the A-direction is 141 μm and a pixel pitch w in the B-direction is 47 μm. A region between the select line 13 and the reset line 14 is a transition region between pixels. The data line 11 in the transition region is obliquely wired. Therefore, accumulation of distortion in the data line 11 can be prevented. In this case, a length of a portion of the data line 11 parallel to the pixel electrode is further smaller than 141 μm.

Although the power line 12 is not shown in FIG. 9, the power line 12 is fundamentally arranged parallel to the data line 11.

Figure 10:
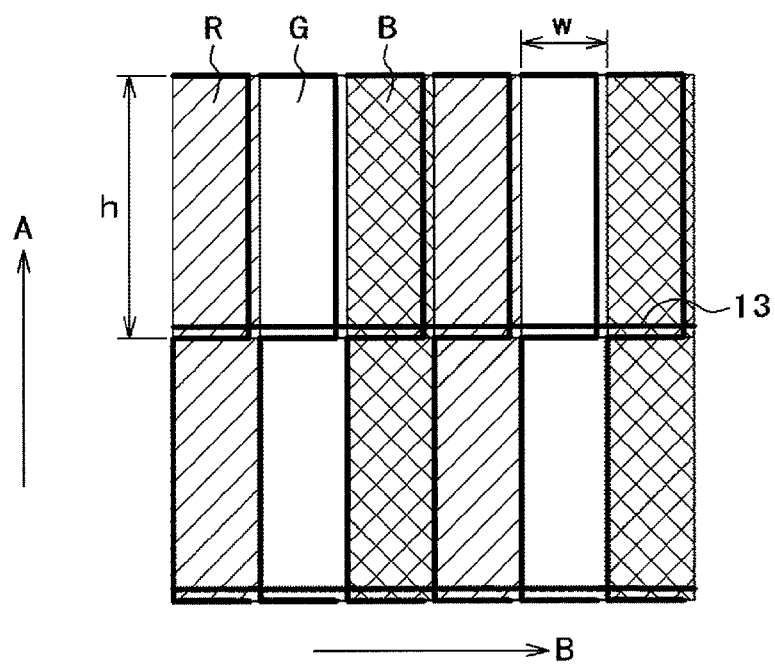
FIG. 10 is a pixel arrangement diagram showing a second modified example of the first embodiment of the present invention.
Figure 11:
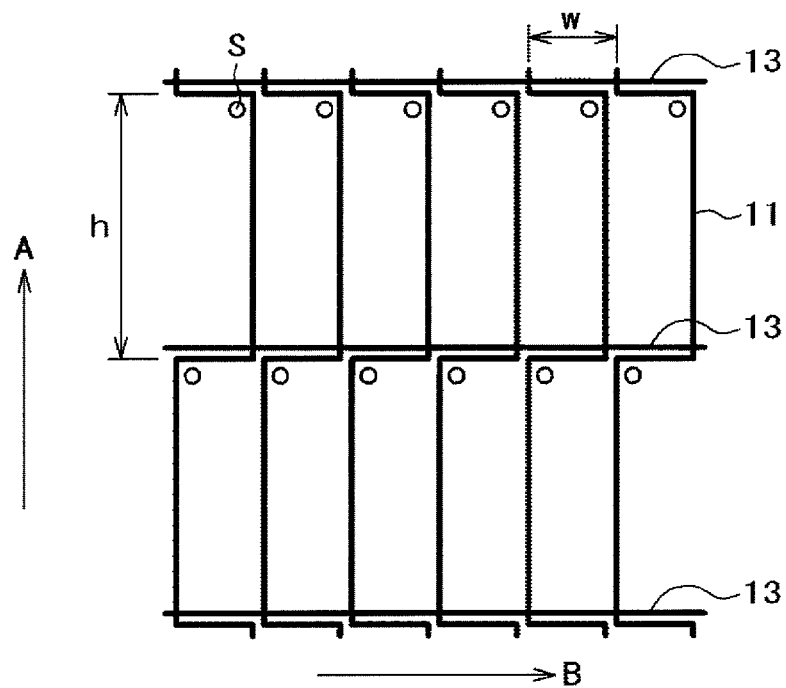
FIG. 11 an arrangement diagram showing data lines of FIG. 10.

FIGS. 10 and 11 show a second modified example of the present embodiment. FIG. 10 shows a pixel arrangement. In FIG. 10, pixels R, G and B longitudinally long are arranged in order in the B-direction. On the other hand, pixels having the same color are arranged in the A-direction. The pixel pitch h in the A-direction is 141 μm, and the pixel pitch w in the B-direction is 47 μm.

FIG. 11 shows a layout of the data line 11 and the signal line corresponding to the pixel arrangement in FIG. 10. To make it clearly understandable, only the data line 11 and the select line 13 are shown in FIG. 11. In FIG. 11, the data line 11 is bent into a crank shape in the A-direction for each pixel. The data line 11 is bent into a crank shape in order to prevent accumulation of distortion in the data line 11 when the display is bent. Because the pixel pitch h in the A-direction is 141 μm, the data line 11 is not broken by distortion in a case of such a length.

As shown in FIG. 11, in response to that the data line 11 is bent into a crank shape, the switching elements S composed of TFTs and the like for capturing the image data to the respective pixels are staggered in the A-direction. This is because it is necessary to supply a signal from the same data line 11 to the pixels having the same color. Although the power line 12 is omitted in FIG. 11, the power line 12 is fundamentally laid out parallel to the data line 11 and into a crank shape.

In FIG. 11, the select line 13 linearly extends in the B-direction. In the present embodiment, it is not assumed that the display is bent in the B-direction, and therefore, distortion is not accumulated even if the select line 13 is linearly arranged. Although the reset line 14 is omitted in FIG. 11, the reset line 14 fundamentally linearly extends parallel to the select line 13 and in the B-direction.

Figure 12:
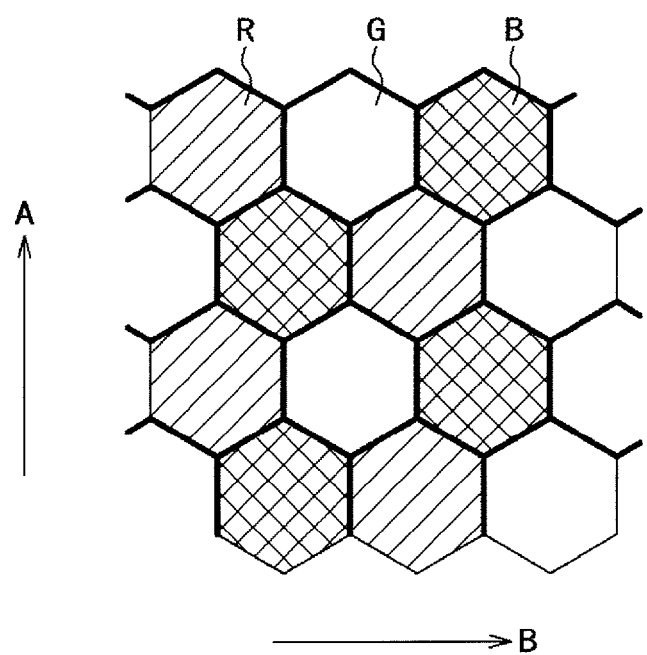
FIG. 12 is a pixel arrangement diagram showing a third modified example of the first embodiment of the present invention.

FIG. 12 shows pixel structure of a third modified example of the present embodiment. In this modified example, the pixel has a hexagonal shape. When the pixels are to be arranged in a mosaic pattern, close packing can be realized if the pixels have a hexagonal shape. The pixel electrode also has a shape close to a hexagonal shape. The data line 11, the select line 13 and the like are laid out to bypass the pixel electrode.

Figure 13A:
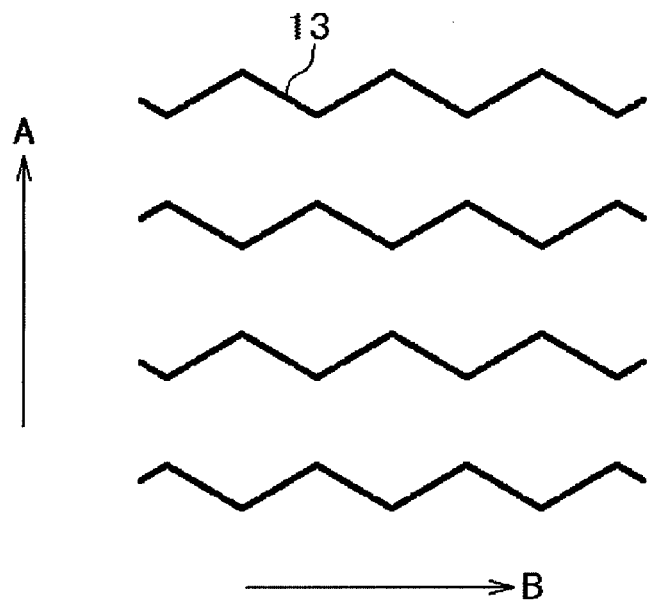
FIG. 13A is a diagram showing shapes of the select lines in a pixel arrangement of FIG. 12.
Figure 13B:
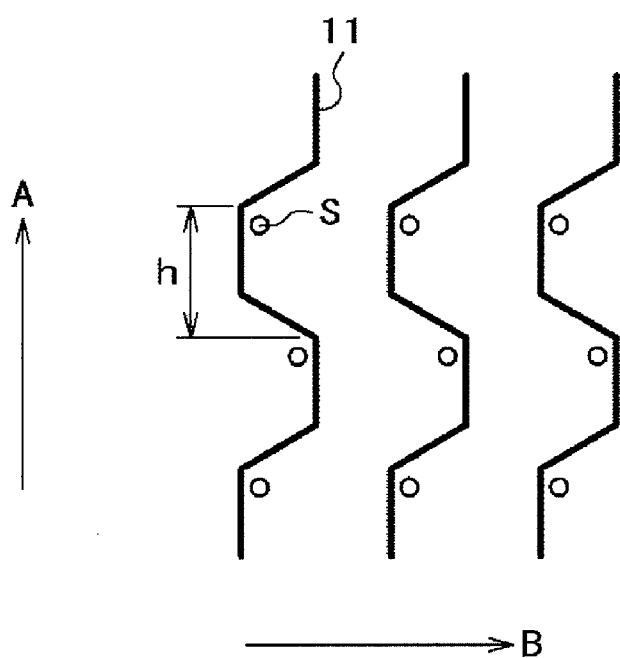
FIG. 13B is a diagram showing shapes of the data lines in the pixel arrangement of FIG. 12.

FIGS. 13A and 13B show a shape of the select line 13 and a shape of the data line 11 in the pixel arrangement in FIG. 12, respectively. FIG. 13A shows the shape of the select line 13. The select line 13 extends in the B-direction and has a wave shape in order to bypass the hexagonal pixel. It is not assumed that the display is bent in the B-direction, and therefore, distortion is not fundamentally accumulated even if the select line 13 is linearly arranged. However, in order to bypass the pixel electrode, the select line 13 is formed into a wave shape. Although the reset line 14 is not shown in FIG. 13A, the reset line 14 is fundamentally formed in a wave shape in the same manner as the select line 13 in order to bypass the pixel electrode.

FIG. 13B shows a shape of the data line 11 corresponding to the pixel arrangement of FIG. 12. In order to bypass the pixel electrode, the data line 11 is laid out into a crank shape connecting a longitudinal line with an oblique line. The switching element S composed of TFTs and the like supplying a data signal to the pixel electrode is connected with the data line 11 in the A-direction in a staggered arrangement. This is because a data signal is supplied to the same pixel from the same data line 11.

In FIG. 13B, a length of a straight portion in the A-direction is smaller than a pixel pitch h in the A-direction. Therefore, when the display is bent, distortion accumulated in the data line 11 can be suppressed. Although the power line 12 is not shown in FIG. 13B, the power line 12 is fundamentally laid out parallel to the data line 11 and into a crank shape.

In the embodiment described above, the data line 11 or the power line 12 is formed into a crank shape or obliquely wired in order to prevent accumulation of distortion in the wire. This is because it is assumed that the display is bent in a direction in which the data line 11 or the power line 12 extends. On the other hand, there is a case in which the display is bent in a direction in which the select line 13 or the reset line 14 extends. In this case, the select line 13 or the reset line 14 may be formed into a crank shape or obliquely wired.

Since a large current flows through the data line 11 or the power line 12, the wire has to be thickened. If the wire is thick, distortion accumulated in the wire increases, and therefore, risk of breakage becomes larger. On the other hand, since the select line 13 or the reset line 14 is only used to apply a voltage to a gate of the TFT, a large current does not flow therethrough, and therefore, the wire does not have to be thickened. Therefore, structure is employed in which the display is bent not in the direction in which the data line 11 extends but in the direction in which the select line 13 or the reset line 14 extends. In addition to this, the select line 13 or the reset line 14 is formed into a crank shape or obliquely wired in order to prevent accumulation of distortion. Thus, the risk of breakage can be further reduced.

In the embodiment described above, the case in which the TFTs are formed over the TFT substrate 3 is described. Even in a case where the TFTs are first formed over the TFT substrate 3 and then the TFTs are transferred to the film base material 1, if the data line 11, the power line 12 and the like are laid out into a crank shape or the oblique wire pattern in order to prevent accumulation of distortion, breakage of the wire when the display is bent can be prevented.

Second Embodiment

In a display region 200 of the organic EL display device, the data line 11, the power line 12, the select line 13, the reset line 14 and the like are arranged to extend with a predetermined width. Of the lines, the power line 12 supplies currents while a plurality of power lines 12 are grouped in the vicinity of a terminal portion formed in an end portion of the TFT substrate 3. Therefore, a width of the power line in the vicinity of the terminal portion is very large. If the width is large, a stress generated in wire when the display is bent increases, and therefore, risk of breakage caused by the stress becomes larger.

In particular, the terminal portion is connected with a TAB, an FPC, a COP and the like. Therefore, when the display is bent, a stress generated in a wire in the vicinity of the terminal portion is larger than stress generated in other portions. That is, both the stress generated in the wire because of the large wire width and the stress generated by a TAB or the like are applied to the vicinity of the terminal portion, and therefore, the risk of breakage becomes large. In the present embodiment, structure reducing the stress generated in the wire in the vicinity of the terminal portion is provided.

Figure 14:
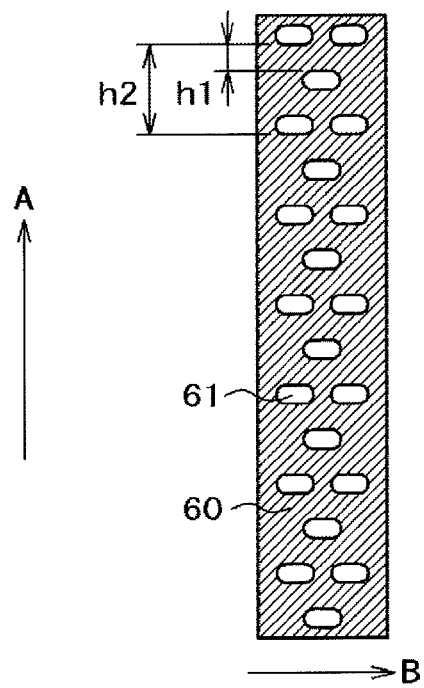
FIG. 14 is a plan view showing wire in the vicinity of terminals according to a second embodiment of the present invention.

FIG. 14 shows an example of the wire in the vicinity of the terminal portion. In FIG. 14, a wire 60 in the vicinity of the terminal portion extends in the A-direction. And, it is assumed that the display is bent in the A-direction. In FIG. 14, the wire 60 in the vicinity of the terminal portion includes openings 61 formed at a predetermined pitch. Because the openings 61 are formed, even when the display is bent, accumulation of distortion in the A-direction in the wire 60 in the vicinity of the terminal portion can be suppressed. That is, because the openings 61 are formed, a length of a region in which the distortion is accumulated is only h1 at some portions of the wire 60 in the vicinity of the terminal portion. A length of a region in which the distortion is accumulated is h2 at other portions. As is apparent from FIG. 14, even if the distortion is accumulated, by selecting the lengths h1 and h2 so that the distortion is within a range causing no breakage, the wire can be prevented from being broken by bending of the display.

Figure 15:
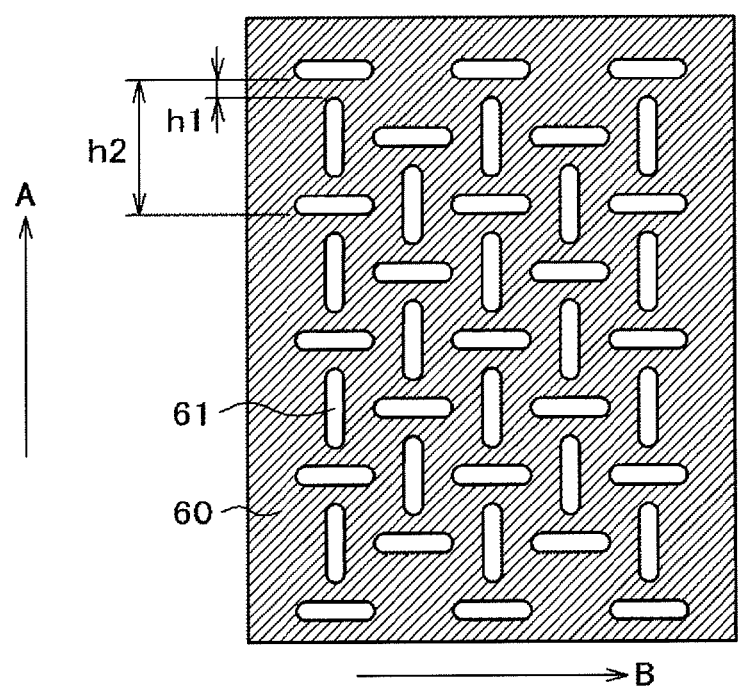
FIG. 15 is a plan view showing another wire in the vicinity of the terminals according to the second embodiment of the present invention.

FIG. 15 shows another example of the wire 60 in the vicinity of the terminal portion in the present embodiment. In the case of FIG. 14, it is assumed that the display is bent in the A-direction. The wire 60 in the vicinity of the terminal portion extends in the A-direction. In FIG. 15, in the wire 60 in the vicinity of the terminal portion, racetrack-shaped openings 61 are regularly formed in the longitudinal direction and the lateral direction. By forming the openings 61 as described above, distortion generated by bending and accumulated in the wire 60 in the vicinity of the terminal portion can be suppressed. That is, in the wire 60 in the vicinity of the terminal portion in FIG. 15, a length of a region in which distortion is accumulated is h1 in some regions. A length of a region in which distortion is accumulated is h2 in other regions. As is apparent from FIG. 15, even if the distortion is accumulated, by selecting the lengths h1 and h2 so that the distortion is within a range causing no breakage, the wire can be prevented from being broken by bending of the display.

In the above, a case of the organic EL display device has been described. However, the present invention can be applied to the liquid crystal display device in the same manner. For example, the wire 60 having a wide width and located in the vicinity of the terminal portion in the second embodiment corresponds to a terminal supplying a current to a common electrode in the liquid crystal display device.

While there have been described what are at present considered to be certain embodiments of the invention, it will be understood that various modifications may be made thereto, and it is intended that the appended claims cover all such modifications as fall within the true spirit and scope of the invention.

What is claimed is:

1. An organic EL display device bendable in a first direction and comprising:
   data lines extending in the first direction and arranged in a second direction;
   select lines extending in the second direction and arranged in the first direction; and
   a TFT substrate having a TFT and an organic EL layer formed in a region surrounded by the data lines and the select lines,
   wherein the data lines include a portion in the first direction and a portion in a direction different from the first direction connected with each other at a predetermined pitch.

2. The organic EL display device according to claim 1, wherein the direction different from the first direction is the second direction.

3. The organic EL display device according to claim 1, wherein the direction different from the first direction is an intermediate direction between the first direction and the second direction.

4. The organic EL display device according to claim 1, wherein the portion in the first direction of the data lines has a length equal to or smaller than 0.5 mm.

5. A liquid crystal display device bendable in a first direction and comprising:
   data lines extending in the first direction and arranged in a second direction;
   scanning lines extending in the second direction and arranged in the first direction; and
   a TFT substrate having a TFT and a pixel electrode formed in a region surrounded by the data lines and the scanning lines,
   wherein the data lines include a portion in the first direction and a portion in a direction different from the first direction connected with each other at a predetermined pitch, and
   wherein the direction different from the first direction is the second direction.

6. The liquid crystal display device according claim 5, wherein the portion in the first direction of the data lines has a length equal to or smaller than 0.5 mm.

* * * * *